United States Patent
Castellucci

[19]

[11] Patent Number: 6,057,972
[45] Date of Patent: May 2, 2000

[54] CURRENT SOURCE FOR A MAGNETORESISTIVE HEAD WITH VARIABILITY AND SELECTABLE SLEW RATE

[75] Inventor: Gregg Romeo Castellucci, Plattsburgh, N.Y.

[73] Assignee: International Business Machines Corporation, Armonk, N.Y.

[21] Appl. No.: 08/950,131

[22] Filed: Oct. 14, 1997

Related U.S. Application Data

[63] Continuation of application No. 08/552,652, Nov. 3, 1995, abandoned.

[51] Int. Cl.[7] .................... G11B 5/09; G11B 5/03; G11B 5/02
[52] U.S. Cl. .................... 360/66; 360/46; 360/67
[58] Field of Search .................... 360/66–68, 46; 327/538, 541, 543; 330/253, 277, 300

[56] References Cited

U.S. PATENT DOCUMENTS

| | | | |
|---|---|---|---|
| 4,390,825 | 6/1983 | Ginn | 318/384 |
| 4,496,909 | 1/1985 | Knapp | 330/277 |
| 4,498,058 | 2/1985 | Benrud | 330/300 |
| 4,540,952 | 9/1985 | Williams et al. | 330/279 |
| 4,706,138 | 11/1987 | Jove et al. | 360/67 |
| 4,879,610 | 11/1989 | Jove et al. | 360/67 |
| 4,881,045 | 11/1989 | Dillman | 330/253 |
| 4,902,984 | 2/1990 | Vinn et al. | 330/252 |
| 4,992,674 | 2/1991 | Smith | 327/59 |
| 5,008,565 | 4/1991 | Taylor | 327/543 |
| 5,153,452 | 10/1992 | Iwamura et al. | 327/541 |
| 5,160,857 | 11/1992 | Barre | 327/541 |
| 5,317,669 | 5/1994 | Anderson et al. | 388/829 |
| 5,337,011 | 8/1994 | French et al. | 330/258 |
| 5,343,164 | 8/1994 | Holmdahl | 330/253 |
| 5,384,501 | 1/1995 | Koyama et al. | 327/336 |
| 5,412,518 | 5/1995 | Christner et al. | 360/66 |
| 5,416,645 | 5/1995 | Fukuyama | 360/46 |
| 5,444,579 | 8/1995 | Klein et al. | 360/67 |
| 5,523,898 | 6/1996 | Jove et al. | 360/113 |
| 5,534,818 | 7/1996 | Peterson | 327/545 |

OTHER PUBLICATIONS

Sedra et al, Mircroelectronics Circuits, pp. 453–454, 1991.
Sedra et al, "The Simple Cascode Configuration", Microelectronic Circuit, p. 466, 1991.
R.J. Christopher and D.E. Conner; Gain and Noise Optimization Method for FET Input Amplifiers; Oct. 1992; vol. 35, No. 5; IBM Technical Disclosure Bulletin.

*Primary Examiner*—Nabil Hindi
*Assistant Examiner*—Regina Y. Neal
*Attorney, Agent, or Firm*—Schmeiser, Olsen & Watts; Robert A. Walsh

[57] ABSTRACT

A low noise current source circuit is disclosed for biasing a magnetoresistive (MR) read head. The current source comprises a field-effect transistor (FET) cascoded to a second transistor which, in turn, is coupled to the MR element. A filter device including a capacitor is coupled across the gate-source junction of the FET, and a sensing device, such as a resistor, is coupled to the gate of the FET for detecting current flowing into said capacitor. Boost circuitry, coupled to the sensing device, boosts the charge/discharge rate of the filter capacitor when the voltage of the sensing device exceeds a certain threshold.

11 Claims, 3 Drawing Sheets

CURRENT SOURCE FOR A MAGNETORESISTIVE HEAD WITH VARIABILITY AND SELECTABLE SLEW RATE

This application is a continuation, of application Ser. No. 08/552,652, filed Nov. 3, 1995, now abandoned.

BACKGROUND OF THE INVENTION

1. Technical Field

This invention generally relates to current sources, and more specifically relates to low noise current sources with variability and selectable slew rates used for magnetoresistive (MR) heads.

2. Background Art

In magnetic technology, a magnetoresistive (MR) read element requires a DC current bias to excite the element. Various techniques are used to bias and sense the change in resistance of the MR head.

One method of generating the DC current bias is achieved by using a low pass feedback loop that maintains a constant DC voltage across the head. The output of the feedback loop is a current source that maintains a constant voltage drop across the MR element. A single stripe MR head requires two connections. One connection is from the current source in the voltage bias control loop. The other connection of the head could be a DC voltage, ground, or another current source. If another current source is used, it is normally regulated by a feedback loop that regulates the common mode voltage of the head to a desired voltage.

Typical low corner frequencies of the voltage bias feedback loop are on the order of 100 KHz to 1 MHz, consequently a low frequency pole is required. The change of resistance of an MR head is very small, generating typically less than 1 mV of sign The small signal requires the bias current through the MR to be low noise.

U.S. Pat. No. 4,879,610, entitled "Protective Circuit for a Magnetoresistive Element," by Jove et al., issued Nov. 7, 1989, and assigned to International Business Machines Corporation, discloses a typical current source circuit design for biasing MR heads. A capacitor is used to filter out noise, and is charged and discharged according to a feedback circuit.

A typical disk drive has two MR heads for each disk or platter. Since each MR head has a different resistance, each MR head may require a different voltage bias for optimum operation. It is important then that the voltage drop across the MR be variable from head to head. As a result, the current or voltage bias must also change, a feature not disclosed in typical MR voltage bias feedback loop circuits.

Furthermore, as the currents through the read head increase, it is difficult to keep the input impedance of the current source high enough to allow noise filtering without the use of a large capacitor. Unfortunately, the slew rate of the current source circuit is limited by how fast this capacitor can be charged, and in a closed loop system where the current may be different for different heads, head switching times are limited in part by the charging rate of the capacitor.

Some other examples of prior art circuitry that affect slew rate and/or show related circuitry are found in the following U.S. Patents and article and are hereby incorporated by reference: U.S. Pat. No. 4,390,825 issued to Ginn in June 1983; U.S. Pat. No. 4,498,058 issued to Benrud in February 1985; U.S. Pat. No. 4,540,952 issued to Williams in September 1985; U.S. Pat. No. 4,706,138 issued to Jove et al. in November 1987; U.S. Pat. No. 4,881,045 issued to Dillman in November 1989; U.S. Pat. No. 4,902,984 issued to Vinn et al. in February 1990; U.S. Pat. No. 4,992,674 issued to Smith in February 1991; U.S. Pat. No. 5,008,565 issued to Taylor in April 1991; U.S. Pat. No. 5,153,452 issued to Iwamura et al. in October 1992; U.S. Pat. No. 5,160,857 issued to Barre in November 1992; U.S. Pat. No. 5,317,669 issued to Anderson et al. in May 1994; U.S. Pat. No. 5,343,164 issued to Holmdahl in August 1994; U.S. Pat. No. 5,384,501 issued to Koyama et al. in January 1995; and "Magnetic Recording Channel Front-Ends" by Klaassen, IEEE Transactions on Magnetics, Vol. 27, No. 6, November 1991.

Although the aforementioned patents describe methods and boost circuits for enhancing the slew rate of a system and other similar features, these boost circuits would normally not work very well for MR current source circuitry since they would change the bias levels of upstream circuitry to reduce the settling time. Settling times of changes of the current source are shorter than what the normal bandpass used for noise filtering and/or the voltage bias control loop. Shorter settling times are required when initially biasing an MR element during head to head switching. Attempting to decrease settling time by increasing the biasing of an upstream amplifier could lead to differences in the current source value in the 'fast settle' mode when compared to the bias level achieved in the normal mode of operation. If the difference is large enough, the circuitry must resettle at normal bias levels during normal mode operations, thus ultimately slowing up the system.

Therefore, there existed a need to provide a current source circuit and boost circuit utilizing technology that would not only allow for variability and a faster head switching time, but would maintain and may even increase stability and noise reduction.

SUMMARY OF THE INVENTION

It is an advantage of the present invention to provide an MR current source circuit with boost circuitry that creates a faster MR head to head switching time, thus allowing for faster computer hard drive reading speeds.

It is a further advantage of the present invention to provide an MR current source circuit with FET (field effect transistor) technology that will allow better filtering of upstream circuitry noise and, if a feedback loop is used to control the current source, loop stability using a single capacitor.

It is yet another advantage of the present invention to provide an MR current source circuit having a boost circuit that does not change the bias levels of upstream circuitry.

In accordance with the present invention, an MR current source circuit is disclosed using FET technology. Furthermore, a method is disclosed to generate a DC current bias. The current source circuit comprises a current biasing device, which is a FET cascoded to a second transistor that is in turn coupled to the MR element. A filter device including a capacitor is coupled across the gate-source junction of the FET, and a sensing device, such as a resistor, is coupled to the gate of the FET for detecting current flowing into a capacitor. Boost circuitry, coupled to the sensing device, boosts the charge/discharge rate of the filter capacitor when the voltage of the sensing device exceeds a certain threshold. The current source circuit can be used either in a stand-alone fashion or in a feedback loop. A method to generate the DC current bias, imbed the DC current bias in a variable voltage bias control loop, and provide a means to allow a rapid slew rate of the current bias in an open or closed loop configuration is also disclosed.

The foregoing and other features and advantages of the invention will be apparent from the following more particular description of preferred embodiments of the invention, as illustrated in the accompanying drawings.

BRIEF DESCRIPTION OF DRAWINGS

The preferred exemplary embodiments of the present invention will hereinafter be described in conjunction with the appended drawings, where like designations denote like elements.

BEST MODE FOR CARRYING OUT THE INVENTION

Figure 1:
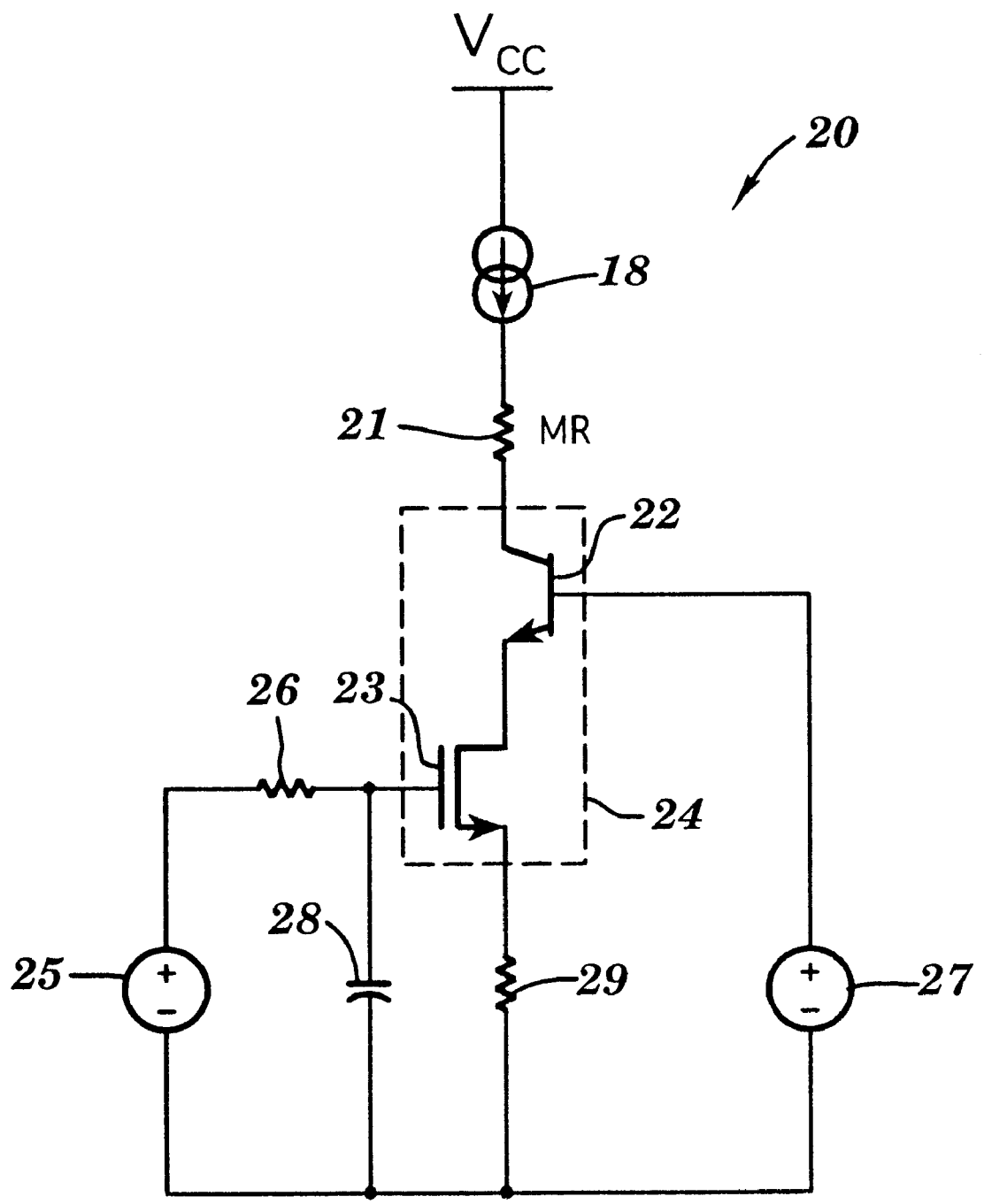
FIG. 1 is a circuit diagram of a current source circuit in accordance with an embodiment of the present invention.

Referring to FIG. 1, a current source circuit 20 in accordance with an embodiment of the present invention is shown. A current biasing device 24 of the current source circuit 20 consists of an N channel FET 23 (T23) cascoded with another N channel FET or bipolar NPN device 22 (T22). T23 is cascoded in order to increase the output impedance of the current source and to keep the voltage of the FET from drain to source constant. Since the device (T23) biasing the MR element 21 needs to be low noise, a noise filter capacitor 28 (C28) from an RC filter is connected from the gate of T23 to the source of T23 to filter noise from upstream circuitry. The base of T22 is biased to a constant voltage with respect to the drain of T23. This increases the output impedance of the current source circuit and improves the power supply rejection. T23 can either be operated in the saturated region, where it acts as a current source and biasing device or in the triode region where it acts as a variable emitter resistor for T22. The RC filter comprising C28 and resistor 26 (R26) is not only used for noise filtering, but also for loop stability when the current source circuit is used in a feedback loop.

Use of the FET 23 allows the use of only one capacitor for loop stability and noise filtering. At MR bias currents of 10 to 20 mA and 5 V supplies, one cannot put a large enough emitter resistor in a BJT to raise its base input impedance high enough to stabilize a feedback loop using a single capacitor or filter low frequency upstream circuitry noise. By tailoring the FET dimensions (width and length) one can minimize the FET gm and minimize the FET intrinsic noise. A MOS FET gate input impedance is high as a result of the device design. The use of a FET also allows one to sense the current flowing into the RC filter, this allows the feedback loop to go into a high slew mode when the current into the RC filter exceeds a threshold, allowing faster MR head to head switching times.

Figure 5:
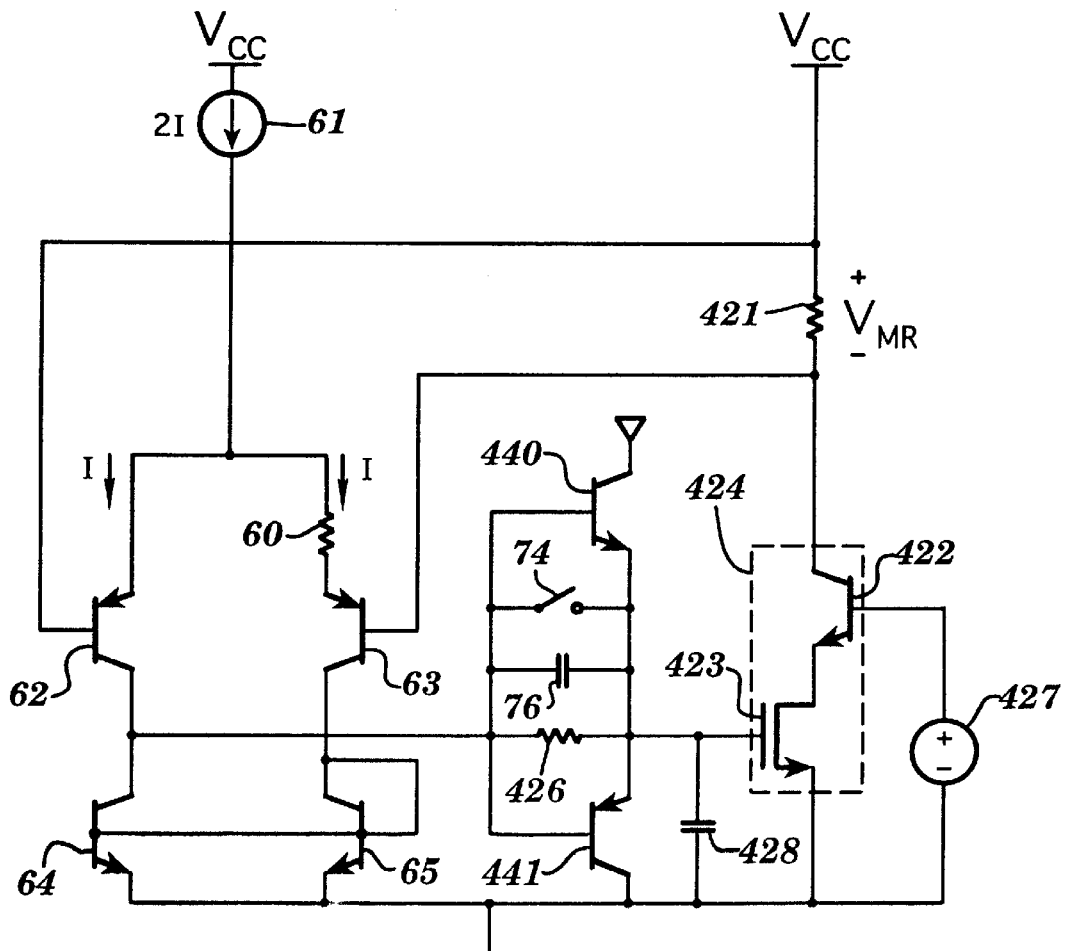
FIG. 5 is a circuit diagram of an alternate embodiment that is fundamentally the same as the circuit shown in FIG. 4.

The read head 21 is biased by a current supplied by the voltage source 25 through the current biasing device 24 and by a current supplied by a sourcing current source 18 that can be made up of complementary devices as shown. Although a current source 18 is shown for the sourcing current source, a fixed voltage or resistance may also be used and is within the scope of the invention. The sourcing current source is typically controlled by a feedback loop (shown in FIGS. 5 and 6) that adjusts the current source such that the common mode of the MR element is at a fixed potential. Because the FET device T23 has low input current at steady state, a current sensing device, which includes a resistor 26, can be placed in series with the gate to detect the current flowing into the filter capacitor 28 (C28) connected to its gate. The current sensing device could be a resistor or diode in its simplest form together with the measuring of the voltage across the resistor or diode. Voltage source 27 is used to bias the cascode device 722, such that T23 is in the linear region. Careful selection of resistor 29 (R29) can reduce the overall noise of the transistor/resistor combination, but may be removed without affecting the stability of the current source of the present invention as seen in FIGS. 5 and 6. R29 can also be implemented through an N channel FET used in the triode region.

Figure 2:
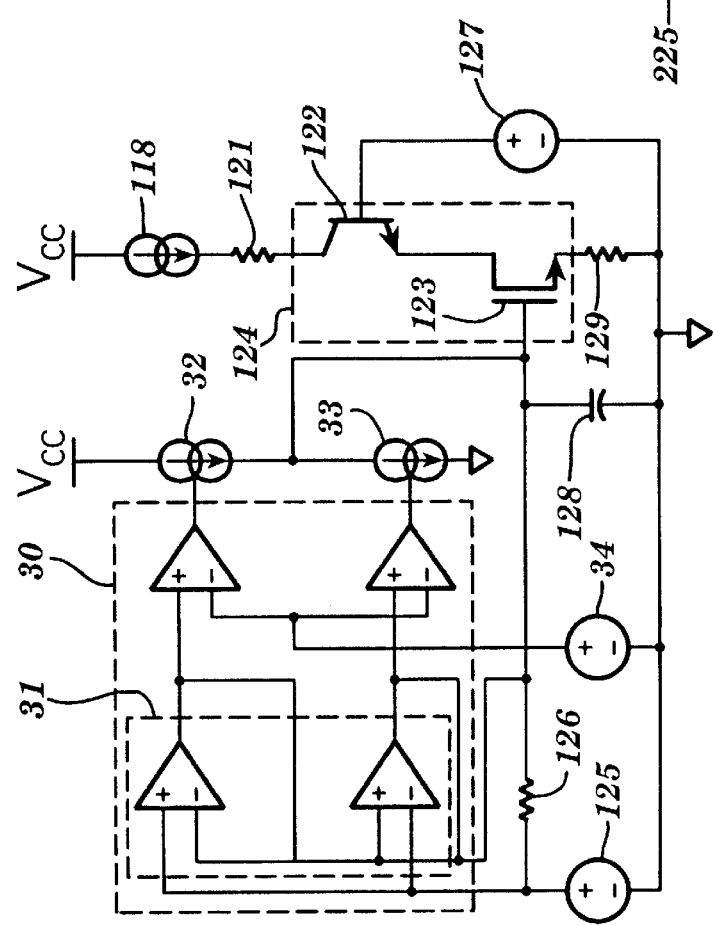
FIG. 2 is a circuit diagram of the current source circuit as shown in FIG. 1 together with boost circuitry in accordance with an embodiment of the present invention.

FIG. 2 shows the current source circuit of FIG. 1 (elements 18–29 corresponding to elements 118–129 respectively) together with a boost circuit (elements 30–34), wherein the boost circuit increases the slew rate of the capacitor 128 of the current source circuit without requiring a change in the bias level of upstream circuitry. When the current, which is sensed through resistor 126 (R126), exceeds a certain threshold, the current boost circuit 30 is enabled to multiply the sensed current through current source 32 and thus increase the charging rate of the capacitor 128 (C128). As the gate of the FET 123 is charged near its steady state level, the sensed current will decrease through current source 33 until the current falls below the threshold. Specifically, differential voltage buffers 31 (one is being inverted) sense the voltage across the resistor R126. This voltage is then compared against a threshold set by voltage source 34. When the threshold is exceeded, either current source 32 or 33 is engaged to rapidly charge and discharge C128. When the voltage drop across R126 falls beneath the threshold, the boost circuit 30 will be disabled and the gate voltage will reach its final steady state using the time constant of R126 and C128.

Figure 3:
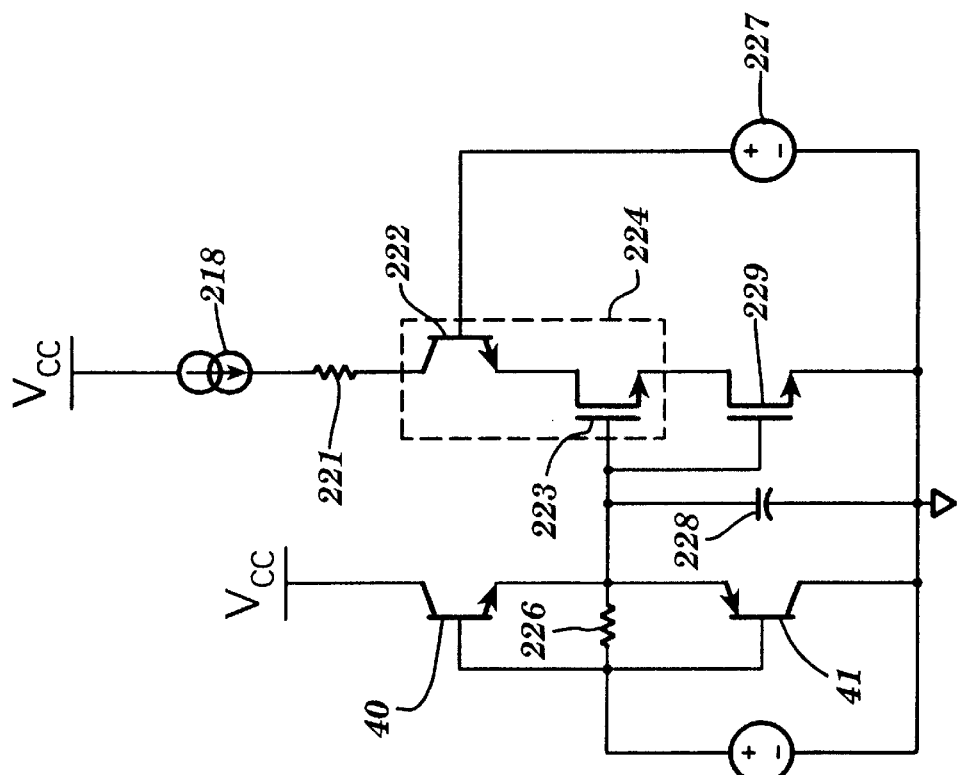
FIG. 3 is a circuit diagram of an alternate embodiment of the circuit as shown in FIG. 2 that is fundamentally the same except the current source circuit uses a transistor in place of a resistor and the boost circuitry has transistors in place of op-amps.

FIG. 3 shows an alternate embodiment to FIG. 2. The current source circuit is fundamentally the same as the current source circuit in FIG. 2 except the resistor R129 of FIG. 2 is replaced by an N channel FET device T229. The N channel FET acts fundamentally like a resistor when used in the triode region and, as with the resistor, will reduce the overall noise of the current source device 222. The current source circuit is shown as elements 218–229 (corresponding with elements 118–129 in FIG. 2). The boost circuitry of FIG. 3 uses transistor devices 40 and 41 that operate fundamentally in the same manner as the operational amplifiers (op-amps) 30, as shown in FIG. 2. Devices 40 and 41 sense the voltage across the resistor 226 (R226). When the voltage drop across R226 exceeds a certain voltage threshold (positive or negative) from the base of the FET 223 to the emitter of the FET 223 ($V_{be}$), either device 40 will turn on, increasing the charge into the capacitor 228 (C228), or device 41 will turn on increasing the charge out of C228. The current biasing device 224 comprises a BJT 222 cascoded to a first N channel FET device 223 having a drain, source and gate. A second N channel FET device 229 is then coupled to the first N channel FET device 223 instead of the resistor R29 as shown in FIG. 1. The source of the first FET 223 is coupled to the drain of the second FET 229 and the gates of the first and second FETs are coupled together. Although the specific circuit of FIG. 3 is shown as an alternative circuit for the boost circuit 30 of FIG. 2, many other appropriate circuits may be used and are within the scope of the invention.

Figure 4:
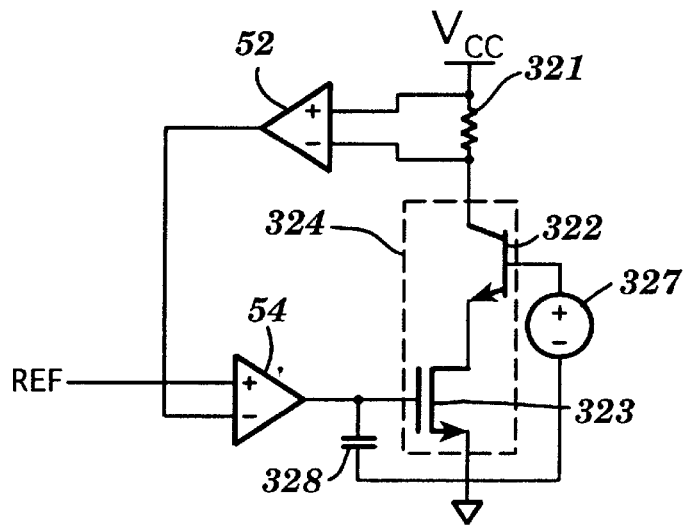
FIG. 4 is a circuit diagram of an alternate embodiment of the current source as shown in FIG. 1 used within an MR voltage bias feedback loop in accordance with a second embodiment of the present invention.

FIG. 4 is a current source circuit, which is fundamentally the same as that shown in FIG. 1, used within a feedback loop. Elements 21–27 in FIG. 1 are shown as elements 321–327 in FIG. 4, excluding the resistors 26 and 29 and voltage source 25. As aforementioned, resistor 29 may be removed without affecting the stability of the current source. The resistor 26 and voltage/current source 25 may be found in the feedback circuitry 52 and 54 and is specifically shown in FIG. 5. The feedback loop circuit comprises a differential voltage buffer 52 with an input and an output, wherein the input is coupled across the resistor 321 (the MR element) for sensing the voltage across the resistor 321. A comparator 54 with a first and second input and an output compares the output of the buffer 52, which is connected to the first input, and a reference voltage (REF), which is connected to the second input. REF can be adjustable to allow variability of the MR voltage bias. The output of the comparator 54 is coupled to the gate of the FET 323, and the capacitor 328. The slew rate of the capacitor is increased/decreased according to the difference in compared voltages (i.e., the output of the comparator 54). Capacitor 328 provides stability and a low pass feedback loop. The object of the feedback loop is to generate a DC voltage across the MR element 321. Beyond the bandwidth of the feedback loop, any voltage generated by the MR element 321 will not be attenuated by the loop.

FIG. 5 shows an alternate embodiment to the circuit shown in FIG. 4. The current source circuit comprises elements 421–428. The resistor 426 is sensed by the boost circuit 440 and 441, which is similar to the boost circuit 40 and 41 of FIG. 3. The resistor 426 and differential amplifiers/comparators 440 and 441 make up the current sensing/amplification section for FIG. 5. Elements 60–65 make up a differential amplifier used in the feedback circuitry. At steady state, the currents through elements 62 and 63 will be nearly identical. The offset voltage generated by one half of the current source 61 and the resistor 60 (R60) will cause an equal voltage to be generated across the MR head 421 by the feedback loop. The current source 61 can be variable to allow a variable MR voltage bias. The RC filter comprises resistor 426 and capacitor 428 as well as the output impedance at the collectors of elements 62 and 64.

Since a faster charging/discharging rate of the capacitor is not always desired, switch 74 is used to disable the current amplification. Capacitor 76, which is parallel to switch 74 and resistor 426, filters out transients that may falsely trigger the circuit. Because of the unique design of the current source and feedback loop, the output of the current source is actually imbedded in the feedback loop. Only one capacitor is required to achieve noise filtering and a low pass feedback loop. Although the specific feedback loop circuit of FIG. 5 is a shown as an alternate circuit to FIG. 4, many other appropriate circuits may be used and are within the scope of the invention.

While the invention has been particularly shown and described with reference to preferred exemplary embodiments thereof, it will be understood by those skilled in the art that various changes in form and details may be made therein without departing from the spirit and scope of the invention.

What is claimed is:

1. A current source circuit for a magnetoresistive (MR) element comprising:
   a current biasing device including
   a first FET having a gate, source and drain, said drain of said first FET cascoded to the source of a second transistor, said current biasing device coupled to said MR element for supplying a variable current to said MR element, and
   a second FET having a gate, source and drain, coupled to said source of said first FET for controlling said current to said MR element, wherein said drain of said second FET is coupled to said source of said first FET and said gate of said second FET is coupled to said gate of said first FET; and
   a filter device including a capacitor coupled to said current biasing device for filtering out excess current.

2. A circuit of claim 1, further comprising a sensing device coupled to said gate of said FET for detecting a rate of current flowing into said capacitor.

3. The circuit of claim 2, further comprising a boost circuit coupled across said sensing device for sensing a voltage on said sensing device and changing said rate of said current flowing into said capacitor when said voltage exceeds a threshold.

4. The circuit of claim 2, further comprising a feedback loop circuit with an amplifier coupled to said MR element and said current biasing device for comparing a voltage across said MR element with a reference voltage and changing said rate of said current flowing into said capacitor when said voltage exceeds a threshold.

5. A method for increasing a slew rate of an MR current source circuit having a filter device including a capacitor, and a boost circuit, comprising the steps of:
   providing a current biasing device including a FET having a gate, source and drain, said drain of said FET cascoded to the source of a second transistor;
   sensing a current flowing into said filter device with said FET; and
   changing a rate of said current flowing into said capacitor when said current exceeds a threshold.

6. The method of claim 5, further comprising the steps of:
   coupling a feedback loop circuit to said MR element and said current source device;
   comparing with a comparator means said voltage across said MR element with a reference voltage; and
   controlling said rate of said current flowing into said capacitor when said voltage exceeds a threshold.

7. The method of claim 6, further comprising the steps of:
   providing a switch coupled to said comparator means; and
   disabling said controlling of said rate of said current flowing through said capacitor.

8. The method of claim 5, further comprising the step of supplying a variable current to said MR element.

9. A current source circuit for a magnetoresistive (MR) element comprising:
   a) a current biasing device including a FET having a gate, source and drain, said FET cascoded to a second transistor coupled to said MR element;
   b) a filter device including a capacitor coupled to said current device;
   c) a sensing device coupled to said gate of said FET; and d) a feedback loop circuit coupled to said MR element and said current biasing device, said feedback loop comprising:
  d1) a differential amplifier means with an input and an output, said input of said differential amplifier means coupled across said MR element; and
  d2) a comparator means with a first and second input and an output, said first input of said comparator means connected to said output of said differential amplifier means, said second input of said comparator means coupled to said gate of said FET, wherein said voltage of said MR element is compared with a reference voltage by said comparator means for controlling said rate of said current flowing through said capacitor.

10. The circuit of claim 9, wherein biasing of said differential amplifier means of said feedback loop circuit remains constant when settling time is decreased.

11. The circuit of claim 9, wherein said feedback loop further comprises a switch coupled to said comparator means for disabling said controlling of said rate of said current flowing through said capacitor.

* * * * *